United States Patent
Nakamura et al.

(10) Patent No.: US 11,317,522 B2
(45) Date of Patent: Apr. 26, 2022

(54) WIRING BOARD MANUFACTURING METHOD

(71) Applicant: MITSUI MINING & SMELTING CO., LTD., Tokyo (JP)

(72) Inventors: Toshimi Nakamura, Ageo (JP); Yoshinori Matsuura, Ageo (JP)

(73) Assignee: MITSUI MINING & SMELTING CO., LTD., Tokyo (JP)

( * ) Notice: Subject to any disclaimer, the term of this patent is extended or adjusted under 35 U.S.C. 154(b) by 15 days.

(21) Appl. No.: 16/495,573

(22) PCT Filed: Mar. 9, 2018

(86) PCT No.: PCT/JP2018/009251
§ 371 (c)(1),
(2) Date: Sep. 19, 2019

(87) PCT Pub. No.: WO2018/173807
PCT Pub. Date: Sep. 27, 2018

(65) Prior Publication Data
US 2020/0113066 A1  Apr. 9, 2020

(30) Foreign Application Priority Data
Mar. 21, 2017  (JP) .............................. JP2017-054868

(51) Int. Cl.
*H05K 3/46*  (2006.01)
*H05K 3/00*  (2006.01)

(52) U.S. Cl.
CPC ......... *H05K 3/4682* (2013.01); *H05K 3/0097* (2013.01); *H05K 3/4652* (2013.01);
(Continued)

(58) Field of Classification Search
CPC .. H05K 3/4682; H05K 3/0097; H05K 3/4652; H05K 2203/1536;
(Continued)

(56) References Cited

U.S. PATENT DOCUMENTS 4,568,413 A   2/1986 Toth et al.
5,937,512 A   8/1999 Lake et al.
(Continued)

FOREIGN PATENT DOCUMENTS

JP   2002-128388 A   5/2002
JP   2015-5644 A   1/2015
(Continued)

OTHER PUBLICATIONS

International Search Report issued in International Patent Application No. PCT/JP2018/009251, dated May 29, 2018; and English-language translation thereof.
(Continued)

*Primary Examiner* — Donghai D Nguyen
(74) *Attorney, Agent, or Firm* — Greenblum & Bernstein, P.L.C.

(57) ABSTRACT

Provided is a method of manufacturing a circuit board involves: preparing a composite laminate including a support, a release layer, and a multilayered circuit board; disposing the composite laminate on a stage such that one face of the composite laminate is put into tight contact with the stage; and releasing the support or the multilayered circuit board from the release layer such that the support or the multilayered circuit board forms a convex face with a curvature radius of 200 to 5000 mm while the face of the composite laminate is kept in tight contact with the stage. The method according to the present invention can prevent the occurrences of defects, for example, breaking in the support and cracking and wire disconnections in the multi- (Continued)

layered circuit board in manufacturing of circuit boards, such as coreless circuit boards, and ensure stable release of the support or the multilayered circuit board.

8 Claims, 3 Drawing Sheets

(52) U.S. Cl.
CPC ............... *H05K 2203/0143* (2013.01); *H05K 2203/1536* (2013.01)

(58) Field of Classification Search
CPC ........ H05K 2203/143; H05K 2203/082; Y10T 29/49126; Y10T 29/49128; Y10T 29/49155
USPC ..................................... 29/831, 846
See application file for complete search history.

(56) References Cited

U.S. PATENT DOCUMENTS

| | | | |
|---|---|---|---|
| 6,166,915 A | 12/2000 | Lake et al. | |
| 6,391,220 B1* | 5/2002 | Zhang | H05K 3/025 29/846 |
| 7,540,079 B2* | 6/2009 | Okuyama | H05K 3/007 29/830 |
| 8,043,936 B2* | 10/2011 | Eguchi | H01L 21/02244 438/458 |
| 10,847,758 B2* | 11/2020 | Kishimoto | H01L 51/003 |
| 2001/0055676 A1* | 12/2001 | Smith | H05K 3/025 428/336 |

FOREIGN PATENT DOCUMENTS

| | | |
|---|---|---|
| JP | 2016-1679 A | 1/2016 |
| JP | 2016-18839 A | 2/2016 |
| KR | 10-2005-0092131 A | 9/2005 |

OTHER PUBLICATIONS

International Preliminary Report on Patentability (IPRP) for International Patent Application No. PCT/JP2018/009251, dated Sep. 24, 2019, including Written Opinion; and English-language translation thereof.

KR Office Action issued in Korean Patent Application No. 10-2019-7019259, dated May 27, 2020, English translation.

* cited by examiner

WIRING BOARD MANUFACTURING METHOD

TECHNICAL FILED

The present invention relates to a method of manufacturing a circuit board.

BACKGROUND ART

In manufacturing of coreless circuit boards through, for example, a coreless build-up process, a composite laminate including a support, a release layer, and a multilayered circuit board is prepared, and the support is released from the composite laminate to leave the multilayered circuit board. In traditional common techniques, the support or the multilayered circuit board is gripped at its end for a mechanical release of the support.

In the latest trends, rigid supports increase whereas thicknesses of multilayered circuit boards decrease. Unfortunately, the release of supports in such a circumstance causes breaking of the supports and cracking and wire disconnections in the multilayered circuit boards.

Various methods of releasing the supports in manufacturing of coreless circuit boards have been proposed. For example, Patent Literature 1 (JP2015-005644A) discloses a method that involves inserting blades into the interface adjacent to the release layer and moving the blades while feeding compressed air to the interface for release of a support.

CITATION LIST

Patent Literature

Patent Literature 1: JP2015-005644A

SUMMARY OF INVENTION

Unfortunately, the technique using the blades in Patent Literature 1 is likely to damage a wiring layer. For example, the blades may slip to damage the wiring layer. In some cases, the wiring layer may be damaged by local stress in the interface adjacent to the release layer during insertion or movement of the blades.

The present inventors have discovered the following fact: a composite laminate including a support, a release layer, and a multilayered circuit board is put into tight contact with a stage while the support or the multilayered circuit board is released from the release layer to form a predetermined convex face. This can prevent occurrences of defects, for example, breaking in the support and cracking and wire disconnections in the multilayered circuit board and ensures stable release.

An object of the present invention is to prevent the occurrences of defects, for example, breaking in a support and cracking and wire disconnections in a multilayered circuit board in manufacturing of a circuit board, such as coreless circuit board, and ensures stable release of the support or the multilayered circuit board.

In accordance with an aspect of the present invention, a method of manufacturing a circuit board involves the steps of:

(a) preparing a composite laminate including, in sequence, a support, a release layer, and a multilayered circuit board;

(b) disposing the composite laminate on a stage such that one face of the composite laminate is put into tight contact with the stage; and (c) releasing the support or the multilayered circuit board from the release layer such that the support or the multilayered circuit board forms a convex face with a curvature radius of 200 to 5000 mm while the face of the composite laminate is kept in tight contact with the stage.

DESCRIPTION OF EMBODIMENTS

Method of Manufacturing Circuit Board

A method of manufacturing a circuit board according to the present invention Involves (a) preparing a composite laminate, (b) placing the composite laminate on a stage, and (c) releasing a support or a multilayered circuit board. The method of manufacturing a circuit board according to the present invention can be referred to as a method of releasing the support or the multilayered circuit board, or separating the support from the multilayered circuit board. In reference to FIGS. 1 to 3, Steps (a) to (c) will now be described.

(a) Provision of Composite Laminate

Figure 1:
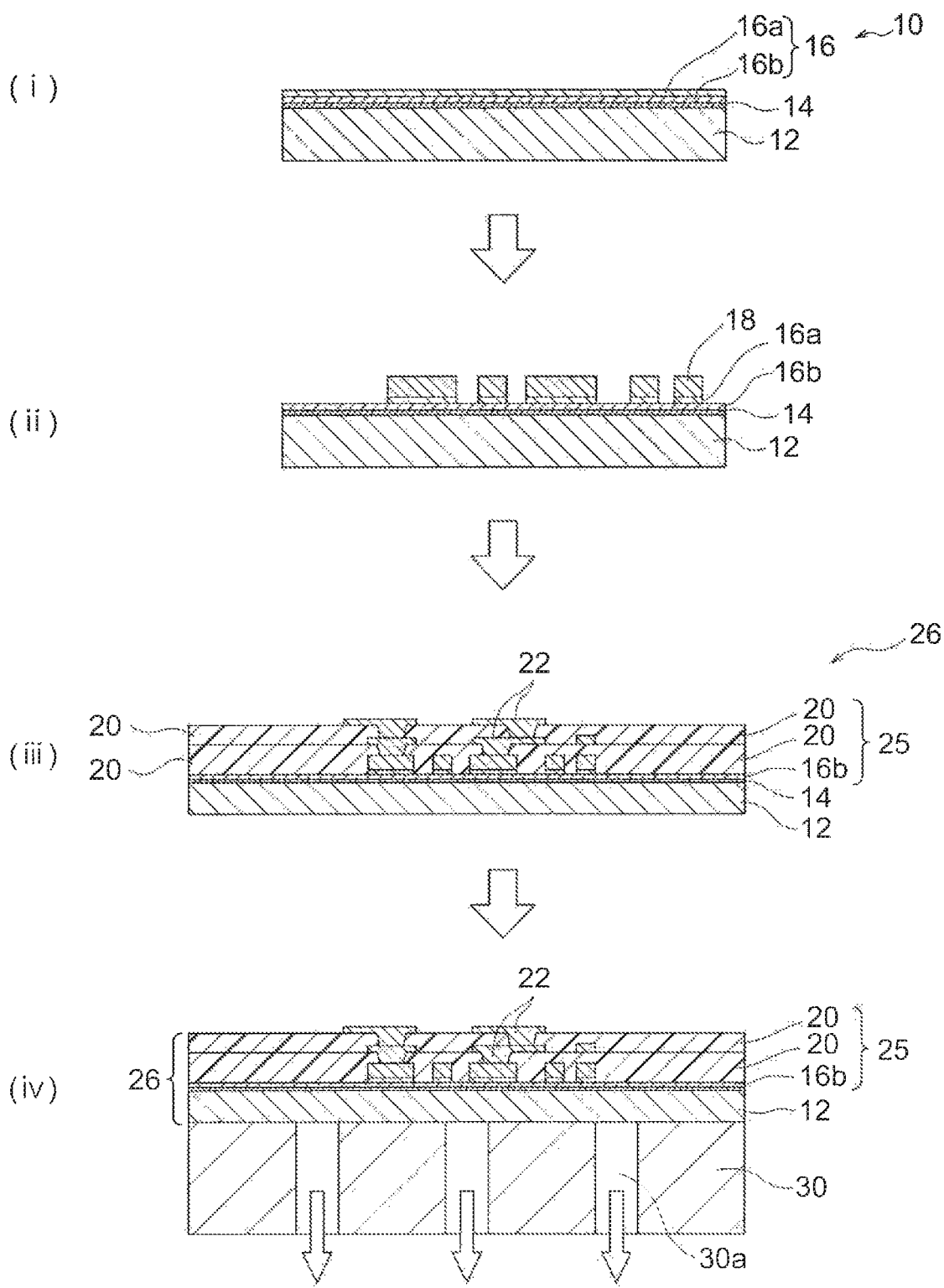
FIG. 1 illustrates Steps (a) and (b) in a method according to the present invention.

As illustrated in FIG. 1 (ill), a composite laminate 26 is prepared that includes a support 12, a release layer 14, and a multilayered circuit board 25 in sequence. Such a composite laminate 26 corresponds to an intermediate product before the release of the support in manufacturing of a multilayered circuit board through, for example, a coreless build-up process. Examples of the support 12 include a glass plate, a metal plate, a ceramic plate, and a resin plate. Examples of the release layer 14 include an organic release layer, an inorganic release layer, a carbon release layer, a releasable adhesive layer. As illustrated in FIG. 1 (iii), the composite laminate 26 preferably includes a build-up layer corresponding to the multilayered circuit board 25 on a laminated sheet 10, such as cupper foil with a carrier. A preferred method of manufacturing the composite laminate 26 including the laminated sheet 10, such as a cupper foil with a carrier, will be described below.

In a preferred embodiment, one end of the composite laminate 26 (specifically the interface on the release layer 14) is preliminarily slit. This can reduce the damage to the composite laminate 26 after start of the release of the support 12 or the multilayered circuit board 25 in Step (c).

A second support (not shown) may be provided on another side, remote from the support 12, of the composite laminate 26. In this case, the composite laminate 26 is reinforced by the second support and thus is not significantly curved locally during the release of the support 12. In other words, the reinforcement can effectively prevent or reduce curving of the composite laminate 26 during the release of the support 12, resulting in reliable connectivity of the multilayered circuit board. The second support is preferably laminated on a second release layer (not shown) that is remote from the support 12 of the composite laminate 26 and has a higher release strength than the release layer 14. Since the second release layer has a higher release strength than the release layer 14, the support 12 or the multilayered circuit board 25 can be selectively separated from the release layer 14, without separation of the second support or the multilayered circuit board 25 from the second release layer. The second release layer may be any known layer, such as an adhesive layer, adhesive release layer, or release layer.

(b) Disposition of Composite Laminate on Stage

As illustrated in FIG. 1 (iv), the composite laminate 26 is subsequently placed on a stage 30. One face of the composite laminate 26 is put into tight contact with the stage 30. The face of the composite laminate 26 to be put into contact with the stage 30 may be the outer surface of the support 12 or the outer surface of the multilayered circuit board 25. The stage 30 may have any shape. The stage 30 is typically flat. In other words, the stage 30 preferably has a flat face on which the composite laminate 26 is to be placed. The stage 30 may be composed of any material, such as metal, ceramic, or resin. Examples of preferred ceramic materials include alumina, zirconia, and silicon carbide. Examples of preferred metal materials include stainless steel, aluminum, and titanium alloys. The stage 30 may be provided with a buffer sheet absorbing an impact or a stress occurring when the composite laminate 26 is brought into contact with the stage 30. Examples of the buffer sheet include a resin sheet, preferably, a rubber sheet, a foamed Teflon® sheet, and a polyurethane sheet.

In Step (b), the fixation strength between the stage 30 and the composite laminate 26 is preferably higher than the release strength between the support 12 and the multilayered circuit board 25. For example, the fixation strength between the stage 30 and the composite laminate 26 in Step (b) is preferably 5 to 250 times, more preferably 25 to 150 times, most preferably 50 to 100 times the release strength of the release layer 14. Such a fixation strength facilitates smooth release of the support 12 or multilayered circuit board 25.

The composite laminate 26 can be put into tight contact with to the stage 30 by any technique. The composite laminate 26 may be put into tight contact with the stage 30 by simple adhesion (for example, adhesion using an adhesive or adhesive tape) or through vacuum suction. Vacuum suction is preferred because it facilitates subsequent detachment of the composite laminate 26. For example, the stage 30 has suction holes 30a in the configuration in FIG. 1. These suction hole 30a are brought into communication with a vacuum pump or vacuum ejector (not shown) to ensure vacuum suction of the composite laminate 26. As described above, the pressure for the vacuum suction can be appropriately determined to be in a range in which the fixation strength between the stage 30 and the composite laminate 26 is higher than the release strength between the support 12 and the multilayered circuit board 25. The pressure for the vacuum suction is typically determined within a range of −20 to −95 KPa, preferably about −40 to −90 KPa, relative to the atmospheric pressure. Such a pressure range leaves no local suction trace on the composite laminate 26 and ensure stable release of the support 12 or the multilayered circuit board 25.

(c) Release of Support or Multilayered Circuit Board

Figure 2:
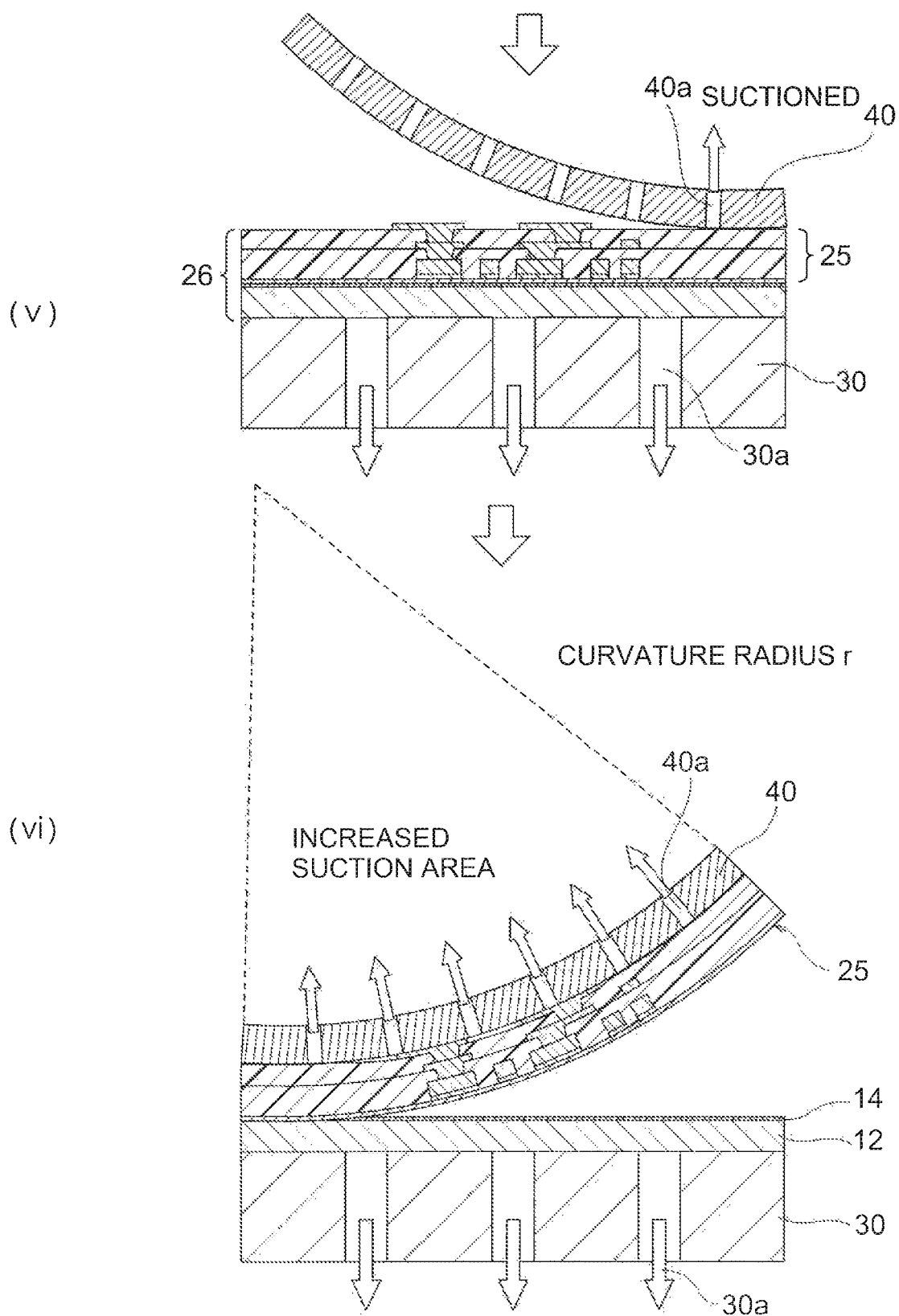
FIG. 2 illustrates an embodiment of Step (c) in the method according to the invention.
Figure 3:
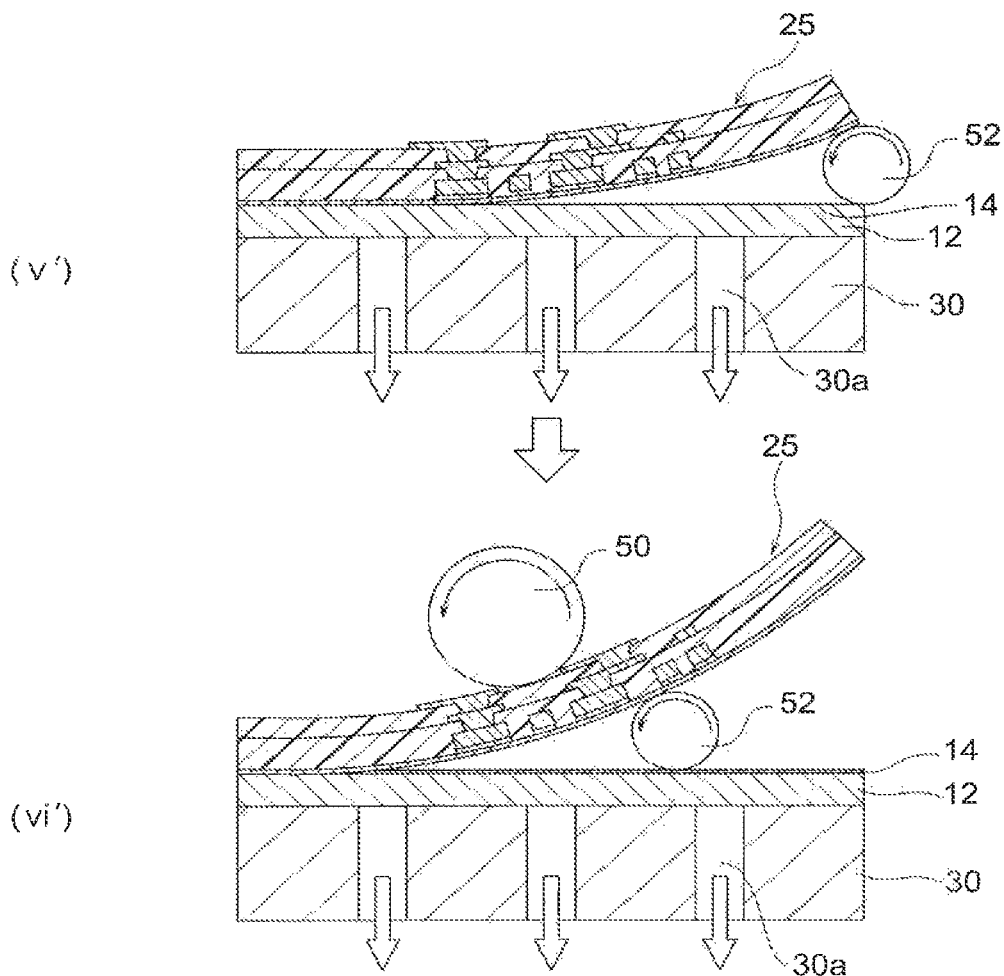
FIG. 3 illustrates another embodiment of Step (c) according to the invention.

Finally, while one face of the composite laminate 26 is put into tight contact with the stage 30, the support 12 or the multilayered circuit board 25 is released from the release layer 14 to form a convex face with a curvature radius of 200 to 5000 mm as illustrated in FIGS. 2 and 3. In this manner, while the composite laminate 26 is put into tight contact with the stage 30, the support 12 or the multilayered circuit board 25 is released from the release layer 14 to form a predetermined convex face. This can prevent the occurrences of defects, for example, breaking in the support 12 and cracking and wire disconnections in the multilayered circuit board 25 and ensure stable release of the support 12 or the multilayered circuit board 25. In the traditional common techniques, a support or a multilayered circuit board is held at its end for a mechanical release of the support. In such techniques, the curvature radius of the support or the multilayered circuit board is too small to avoid stress concentration on the support or the multilayered circuit board. The support or the multilayered circuit board is thus likely to be damaged. The same problem also occurs in the technique disclosed in Patent Literature 1 where blades are inserted into the interface adjacent to the release layer. In the present invention, the support 12 or the multilayered circuit board 25 is released to form a convex face with a curvature radius of 200 mm or more, resulting in reductions in the stress concentration on the support 12 or the multilayered circuit board 25 and the damage occurring from the small curvature radius. Furthermore, the convex face having a curvature radius of 5000 mm or less and the tight contact of one face of the composite laminate 26 with the stage 30 ensures significantly ready and effective release of the support 12 or the multilayered circuit board 25, resulting in a dramatically improved productivity. In other words, multilayered circuit boards 25 can be manufactured in a high yield rate and high productivity.

The convex face formed by the support 12 or the multilayered circuit board 25 during the release of the support 12 or the multilayered circuit board 25 has a curvature radius of 200 to 5000 mm, preferably 300 to 3500 mm, more preferably 350 to 3000 mm, particularly preferably 600 to 1900 mm, most preferably 1000 to 1800 mm. The curvature radius within these ranges can more efficiently achieve the advantageous effects of the present invention.

In Step (c), a cylindrical head is preferably brought into contact with the face, remote from the stage 30, of the composite laminate 26. In this embodiment, the cylindrical head may be a complete cylinder having a circular cross-section, like a cylindrical head 50 in FIG. 3 or an incomplete or partial cylinder having an arcuate or sectorial cross-section, like a cylindrical head 40 in FIG. 2. The cylindrical head may have a substantially ellipsoidal shape. As long as the advantageous effect of the present invention is ensured, the face of the cylindrical head may partially undergo grooving, cavitation, and/or boring. The cylindrical head may be composed of any material, for example, metal, ceramic, or resin. Preferred examples of such materials include stainless steel, aluminum, and titanium alloys. The cylindrical head may be provided with a buffer sheet absorbing an impact or a stress occurring when it comes into contact with the composite laminate 26. A typical example of the buffer sheet is a silicon rubber sheet.

As illustrated in FIG. 2, it is preferred to 1) put one end of a face, remote from the stage 30, of the composite laminate 26 into tight contact with the cylindrical head 40 and then 2) roll the cylindrical head 40 on the composite laminate 26 to increase the area of the composite laminate 26 in tight contact with the cylindrical head 40. The support 12 or the multilayered circuit board 25 is thereby released from the release layer 14. In this case, the cylindrical head 40 has a predetermined curvature radius of 200 to 5000 mm. Tight fixation of the composite laminate 26 to the cylindrical head 40 can readily impart a convex face with a curvature radius of 200 to 5000 mm to the support 12 or the multilayered circuit board 25. In this embodiment, the cylindrical head 40 preferably has suction holes 40a. These suction holes 40a are in communication with a vacuum pump or a vacuum ejector. In other words, Step (c) preferably involves vacuum suction. This can more effectively achieve tight fixation of the support 12 or the multilayered circuit board 25 to the cylindrical head 40 and the convex face described above. In this embodiment, the cylindrical head 40 may be provided with a suction instrument, for example, a sucker or a suction pad. A preferred sucking operation of the suction instrument is vacuum suction. The pressure for the vacuum suction is preferably determined to −20 to −95 KPa, more preferably about −40 to −90 KPa. Such a pressure range does not leave local suction traces on the composite laminate 26 and ensure stable release of the support 12 or the multilayered circuit board 25.

Alternatively, as illustrated in FIG. 3, it is also preferred to 1) place a roller 52 between the support 12 and the multilayered circuit board 25 at one end of the composite laminate 26 and then 2) roll the cylindrical head 50 and the roller 52 synchronously for release of the support 12 or the multilayered circuit board 25 from the release layer 14. In this case, the control of the radii of the roller 52 and the cylindrical head 50 and the geometry between the roller 52 and the cylindrical head 50 can readily impart a convex face with a curvature radius of 200 to 5000 mm to the support 12 or the multilayered circuit board 25. In this embodiment, the roller 52 disposed between the support 12 and the multilayered circuit board 25 promotes the release of the support 12 or the multilayered circuit board 25, while the cylindrical head 50 applies downward force to the released support 12 or the released multilayered circuit board 25 to prevent lifting up and bending of the released support 12 or the released multilayered circuit board 25 (avoiding a significantly small curvature radius).

In any of the embodiments described above, the releasing rate for releasing the support 12 or the multilayered circuit board 25 from the release layer 14 in Step (c) is preferably 0.01 to 2.0 m/s, more preferably 0.05 to 1.0 m/s, further preferably 0.1 to 0.5 m/s. The range ensures smooth and effective release of the support or the multilayered circuit board. The releasing rate may be varied between the start and end of the release.

In Step (c), the fixation strength between the stage 30 and the composite laminate 26 is higher than the release strength between the support 12 and the multilayered circuit board 25. For example, the fixation strength between the stage 30 and the composite laminate 26 in Step (c) is preferably 5 to 250 times, more preferably 25 to 150 times, further preferably 50 to 100 times the release strength of the release layer 14. Such a fixation strength facilitates a smooth release of the support 12 or the multilayered circuit board 25.

The technique for putting the composite laminate 26 into tight contact with the stage 30 in Step (b) may also be employed in Step (c). The techniques described in Step (b) such as the vacuum suction may thus be applied to Step (c).

During Step (c), compressed air may be fed to the interface on the release layer 14 to facilitate the release of the support 12 or the multilayered circuit board 25.

Step (c) may be performed in a liquid. In the case that the release layer 14 is an adhesive layer (specifically a soluble adhesive layer), a liquid that can dissolve the adhesive layer facilitates the release of the support 12 or the multilayered circuit board 25.

(d) Miscellaneous

Although the embodiments above have been described from the viewpoint of the release of the support 12 or the multilayered circuit board 25 from the release layer 14, Step (c) in the present invention is also applicable to the release of the second support (not shown) or the multilayered circuit board 25 from the second release layer (not shown).

At least one side of the support 12 and/or the second support preferably extends from one end of the multilayered circuit board 25. This facilitates suction of this end to the cylindrical head 40 and disposition of the roller 52 between the support 12 and the multilayered circuit board 25 during the release of the support 12 or the second support, resulting in a ready release of the support 12 or the second support.

Production of Composite Laminate

A preferred method of producing a composite laminate in Step (a) in the present invention will now be described with reference to FIG. 1. The method of manufacturing a composite laminate 26 involves the substeps of (1) preparing a laminated sheet 10, (2) forming a first wiring layer 18, and (3) forming the composite laminate 26.

(1) Provision of Laminated Sheet

As illustrated in FIG. 1 (i), the laminated sheet 10 as a base for formation of the multilayered circuit board is prepared. The laminated sheet 10 includes a support 12, a release layer 14, and a metal layer 16 in sequence. The laminated sheet 10 may be in the form of a so-called cupper foil with a carrier.

The support 12 may be made of any material, such as glass, ceramic, resin, or metal. The support 12 may have any form, such as a sheet, a film, a plate, or a foil. Further, the support 12 may be a laminate of these sheets, films, plates and/or foils. For example, the support 12 may be a rigid support, such as a glass plate, a ceramic plate or a metal plate, or may be a non-rigid support, such as a metal foil or a resin film. Preferred examples of the support 12 include metal sheets, glass sheets, ceramic plates, laminates of metal sheets and prepregs, metal sheets coated with adhesives, and resin sheets (in particular hard resin sheets). Preferred examples of the metal of the support 12 include copper, titanium, nickel, stainless steel, and aluminum. Preferred examples of the ceramics include alumina, zirconia, silicon nitride, and aluminum nitride (fine ceramics). Preferred examples of the resin include epoxy resins, aramid resins, polyimide resins, polyamide or nylon resins, liquid crystal polymers, PEEK resins, polyamideimide resins, polyethersulfone resins, polyphenylene sulfide resins, PTFE resins, and ETFE resins. More preferably the thermal expansion coefficient (CTE) is less than 25 ppm/K (preferably 1.0 to 23 ppm/K, more preferably 1.0 to 15 ppm/K, further more preferably 1.0 to 10 ppm/K), from the viewpoint of preventing warpage of a coreless support due to heat when an electronic device is mounted. Examples of such materials include various resins as described above (especially resins with low thermal expansion, such as polyimide resins or liquid crystal polymers), prepregs made of various resins and glass fibers as described above, glass, and ceramics. In view of handling properties and securing the flatness when a chip is mounted, the support 12 has a Vickers hardness of preferably 500 to 3000 HV, more preferably 550 to 2500 HV, further more preferably 600 to 2000 HV.

For materials that satisfies these properties, the support 12 is preferably composed of a resin film, glass or ceramic, more preferably glass or ceramic, particularly more preferably glass. For example, the support 12 is a glass sheet. The support 12 composed of glass has light weight, low thermal expansion coefficient, high insulating properties, high rigidity and high surface flatness, and thus the metal layer 16 has a significantly smooth surface. In addition, the support 12 composed of glass has some advantages, for example, surface flatness (coplanarity) favorable to mounting of the electronic device, and chemical resistance during the desmear step and various plating steps in a manufacturing process of the printed wiring board. Preferred examples of the glass constituting the support 12 include quartz glass, borosilicate glass, alkali-free glass, soda-lime glass, aluminosilicate glass, and combinations thereof, more preferably alkali-free glass. The alkali-free glass, which contains substantially no alkali metal, contains silicon dioxide, aluminum oxide, boron oxide, an alkaline earth metal oxide, such as calcium oxide or barium oxide as main components, and further contains boric acid. Since the alkali-free glass has a low thermal expansion coefficient in the range of 3 to 5 ppm/K over a wide temperature range from 0'C to 350° C., the warpage of the glass can be advantageously minimized when a semiconductor chip is mounted as an electronic device.

The support 12 has a thickness of preferably from 100 to 2000 µm, more preferably from 300 to 1800 µm, further more preferably from 400 to 1100 µm. At a thickness within such ranges, the printed wiring board can be thinned while retaining adequate strength that does not interfere handling and electronic parts can be mounted with reduced warpage.

The surface, adjacent to the release layer 14 (adjacent to an adhesive metal layer if present), of the support 12 has an arithmetic mean roughness Ra of preferably 0.1 to 70 nm, more preferably 0.5 to 60 nm, further more preferably 1.0 to 50 nm, particularly more preferably 1.5 to 40 nm, most preferably 2.0 to 30 nm as measured in accordance with JIS B 0601-2001. A smaller arithmetic mean roughness on the surface, adjacent to the release layer 14, of the support 12 desirably causes a smaller arithmetic mean roughness Ra on the surface, remote from the release layer 14 (the outer surface of the metal layer 16), of the metal layer 16. As a result, the roughness Ra is suitable for forming a wiring pattern highly refined to a line/space (L/S) ratio of 13 µm or less/13 µm or less (for example, from 12 µm/12 µm to 1 µm/1 µm) in a printed wiring board manufactured with the laminated sheet 10.

The laminated sheet 10 may have an optional adhesive metal layer and/or an optional auxiliary release layer, preferably in this order, on the surface, adjacent to the release layer 14, of the support 12.

The optional adhesive metal layer is preferably composed of at least one metal selected from the group consisting of Ti, Cr and Ni, and may be a pure metal or an alloy from the viewpoint of assuring the adhesion to the support 12. The metal composed of the adhesive metal layer may contain incidental impurities derived from, for example, raw material components and a formation process of film. Also, the metal may contain oxygen derived from the air when the adhesive metal layer is exposed to the atmosphere after the formation of film. The adhesive metal layer is preferably formed by a gas-phase process such as sputtering. In particular, the adhesive metal layer is preferably formed by a magnetron sputtering process with a metal target because the process can improve the uniformity of distribution in film thickness. The adhesive metal layer has a thickness of preferably 5 to 500 nm, more preferably 10 to 300 nm, further more preferably 18 to 200 nm, particularly more preferably 20 to 150 nm.

An optional auxiliary release layer is preferably composed of copper in view of controlling release strength in association with the release layer 14 into a desired value. The copper that constitutes the auxiliary release layer may contain incidental impurities derived from, for example, raw material components or a formation process of film. The auxiliary release layer is preferably formed by a gas-phase process such as sputtering. In particular, the auxiliary release layer is preferably formed by a magnetron sputtering process with a copper target because the process can improve the uniformity of distribution in film thickness. The auxiliary release layer has a thickness of preferably 5 to 500 nm, more preferably 10 to 400 nm, further more preferably 15 to 300 nm, particularly more preferably 20 to 200 nm.

The release layer 14 may be composed of any material that enables the release of the support 12. For example, the release layer 14 can be composed of a known material employed as a release layer of a copper foil with a carrier. The release layer 14 may be either an organic release layer or an inorganic release layer. Examples of organic components used in the organic release layer include nitrogen-containing organic compounds, sulfur-containing organic compounds, and carboxylic acids. Examples of the nitrogen-containing organic compounds include triazole compounds and imidazole compounds. Examples of the inorganic components used in the inorganic release layer include at least one metal oxide selected from the group consisting of Ni, Mo, Co, Cr, Fe, Ti, W, P and Zn, mixture of metals and nonmetals, and carbon. It is preferred that the release layer 14 is a layer mainly containing carbon, more preferably a layer mainly composed of carbon or hydrocarbon, and further more preferably a film of amorphous carbon as hard carbon, or a carbon-nitrogen mixture from the viewpoint of ready separation and formation of film. The release layer 14 has a thickness of preferably 1 to 20 nm, more preferably 1 to 10 nm.

The release layer 14 preferably has a release strength of 1 to 30 gf/cm, more preferably 3 to 20 gf/cm, further more preferably 4 to 15 gf/cm in order to minimize the stress concentration to the first wiring layer 18 to the utmost and thereby facilitate the release process when the release layer 14 is separated. The release strength of the release layer 14 is measured as follows: A release layer 14 is formed on a support 12, a copper layer as a metal layer 16 is formed on the release layer to give a laminated sheet, an electroplated copper film having a thickness of 18 µm is formed on the laminated sheet, and a copper-clad laminate is thereby formed; and then, the release strength (gf/cm) is measured in accordance with JIS C 6481-1996 when the electroplated copper film integrated with the metal layer 16 is separated.

The release strength of the release layer 14 can be adjusted by, for example, controlling the thickness of the release layer 14, or selecting the composition of the release layer 14.

The metal layer 16 is composed of metal, and preferably includes a power supply sublayer 16a to supply power to the first wiring layer 18 described below. The metal layer 16 or the power supply sublayer 16a may be a copper foil produced by any process, for example, a wet process, such as an electroless copper plating or an electrolytic copper plating; a physical vapor deposition process, such as sputtering or vacuum vapor deposition; chemical vapor deposition; or a combination thereof. The preferred metal that constitutes the power supply sublayer 16a is copper and thus the preferred power supply sublayer 16a can be an extremely thin copper layer. The power supply sublayer 16a is composed of particularly preferably a copper layer deposited by a gas-phase process, such as sputtering or vacuum vapor deposition, and most preferably a copper layer deposited by the sputtering in order to appropriately build a fine pitch through an extremely thinning process. Although the extremely thin copper layer is preferably a non-roughened copper layer, it may be subjected to preliminary roughening or secondary roughening, such as soft etching, cleaning, or oxidation-reduction, as long as the roughening process does not interfere with the formation of a wiring pattern when a printed wiring board is manufactured. The power supply sublayer 16a (for example, an extremely thin copper layer) constituting the metal layer 16 may have any thickness of, preferably 50 to 3000 nm, more preferably 70 to 2500 nm, further more preferably 80 to 2000 nm, particularly preferably 90 to 1500 nm, particularly more preferably 120 to 1000 nm, most preferably 150 to 500 nm in order to form a fine pitch as described above. The power supply sublayer 16a having a thickness within the above range (for example, an extremely thin copper layer) is preferably manufactured by a sputtering process from the viewpoint of the in-plane uniformity of the layer thickness and the productivity to yield a layer in the form of a sheet or a roll.

The surface, remote from the release layer 14 (the outer surface of the metal layer 16), of the metal layer 16 has an arithmetic mean roughness Ra of preferably 1.0 to 100 nm, more preferably 2.0 to 40 nm, further more preferably 3.0 to 35 nm, particularly more preferably 4.0 to 30 nm, most preferably from 5.0 to 15 nm as measured in accordance with JIS B 0601-2001. A smaller arithmetic mean roughness is suitable for forming a wiring pattern more highly refined to a line/space (l/S) ratio of 13 µm or less/13 µm or less (for example, from 12 µm/12 µm to 1 µm/1 µm) in a printed wiring board manufactured with the laminated sheet 10. In the case of such a smooth surface, a contactless surface roughness measurement is preferably employed in the measurement of the arithmetic mean roughness Ra.

The metal layer 16 may have a multilayer structure composed of two or more sublayers. For example, the metal layer 16 may have an antireflection sublayer 16b on the surface, adjacent to the release layer 14, of the power supply sublayer 16a in addition to the power supply sublayer 16a, as illustrated in FIG. 1. In other words, the metal layer 16 may include the power supply sublayer 16a and the antireflection sublayer 16b. The antireflection sublayer 16b is preferably composed of at least one metal selected from the group consisting of Cr, W, Ta, T, Ni and Mo. At least the surface, adjacent to the power supply sublayer 16a, of the antireflection sublayer 16b is preferably composed of aggregates of metal particles. The antireflection sublayer 16b may have a structure which is entirely composed of the aggregates of metal particles, or a multilayer structure including a subsublayer composed of the aggregates of metal particles and a subsublayer that is not composed of particles below the subsublayer composed of the particles. The aggregates of metal particles constituting the surface, adjacent to the power supply sublayer 16a, of the antireflection sublayer 16b exhibits a desirable dark color caused by a metal material and a particulate form, and the dark color results in a desirable visual contrast to the wiring layer composed of copper and thereby improves the visibility in image inspection (for example, automatic optical inspection (AOI)).

The antireflection sublayer 16b is composed of at least one metal selected from Cr, W, Ta, Ti, Ni and Mo, preferably at least one metal selected from Ta, Ti, Ni and Mo, more preferably at least one metal selected from Ti, Ni and Mo, most preferably Ti. These metals may be pure metals or alloys. In any case, these metals are preferably not inherently oxidized (essentially not metal oxides) to exhibit a desired dark color which can improve a visual contrast to Cu. In particular, the antireflection sublayer 16b has an oxygen content of preferably 0 to 15 atomic %, more preferably 0 to 13 atomic %, further more preferably 1 to 10 atomic %. In any case, the metals do not dissolve in a copper flash etching solution, and thereby can exhibit excellent chemical resistance to the copper flash etching solution. The antireflection sublayer 16b has a thickness of preferably 1 to 500 nm, more preferably 10 to 300 nm, further more preferably 20 to 200 nm, most preferably 30 to 150 nm.

(2) Formation of First Wiring Layer

As illustrated in FIG. 1 (ii), the first wiring layer 18 is formed on the metal layer 16. The first wiring layer 18 is typically formed through a known process involving formation of a photoresist layer, formation of an electroplated copper film, stripping of a photoresist layer, and optional copper flash etching. For example, the first wiring layer 18 is formed as follows: a photoresist layer is formed in a predetermined pattern on the metal layer 16, where the photoresist is preferably a photosensitive film, for example, a photosensitive dry film, and the photoresist layer may be given a predetermined pattern through exposure and development; an electroplated copper film is formed at exposed areas (in other words, the areas that are not masked by the photoresist layer) of the metal layer 16, where any known technique for electroplating may be employed; and the photoresist layer is subsequently released. As a result, the electroplated copper film in a wiring pattern is left as a first wiring layer 18 while the areas of the metal layer 16 that do not form the wiring pattern are exposed.

If the metal layer 16 includes not only the power supply sublayer 16a but also antireflection sublayer 16b, the area, corresponding to the power supply sublayer 16a, in the metal layer 16 may be removed through flash etching for exposure of the antireflection sublayer 16b. This facilitates the optical inspection of the first wiring layer 18, which will be described below. A flash etching solution is preferably a mixture of sulfuric acid and hydrogen peroxide or contains at least one of sodium persulfate and potassium persulfate in view of avoiding excessive etching of the electroplated copper film while certainly etching the exposed metal layer 16. If the metal layer 16 includes the antireflection sublayer 16b, the areas, not forming the wiring pattern, of the antireflection sublayer 16b are left and exposed without being dissolved in the flash etching solution. At least one of Cr, W, Ta, Ti, Ni, and Mo that are candidate constituents of the antireflection sublayer 16b is not dissolved in a copper flash etching solution and thus exhibits a high chemical resistance to the copper flash etching solution. In other words, if the metal layer 16 includes the antireflection sublayer 16b, the antireflection sublayer 16b is preferably left and exposed without being removed with the copper flash etching solution to undergo the subsequent optical inspection process as required.

After the flash etching, the antireflection sublayer 16b may be kept exposed and the coreless support with the wiring layer (in detail, the first wiring layer 18) may be subjected to the optical inspection process, as required. The optical inspection typically involves radiation of predetermined light from a light source of an automatic optical inspection (AOI) device for capture of a binarized image of the wiring pattern, trial of pattern matching between the binarized image and a designed data image, and evaluation of the matching between them. The agglomerates of metal particles constituting the surface, adjacent to the power supply sublayer 16a, of the antireflection sublayer 16b exhibits a desirable dark color of a metal material and a particulate form, and the dark color results in a desirable visual contrast to the first wiring layer 18 and thereby improves the visibility in optical inspection (for example, automatic optical inspection (AOI)).

(3) Formation of Composite Laminate

As illustrated in FIG. 1 (iii), insulating layers 20 and wiring layers 22 are alternatively formed on the first wiring layer 18 of the laminated sheet 10 into a multilayered circuit board 25 or a composite laminate 26 including the first wiring layer 18 in the form of an embedded wiring layer. One or more wiring layers 22 are provided, each of which may be referred to as the n-th wiring layer 22 after the representation of the first wiring layer 18, where n is an integer of 2 or more. One or more insulating layers 20 may be provided. In other words, the multilayered circuit board 25 according to the present invention includes at least two wiring layers (i.e., at least the first wiring layer 18 and a second wiring layer 22) and at least one insulating layer 20. The sequential layer structure including the first wiring layer 18, the n-th wiring layers 22, and the insulating layer(s) 20 is generally referred to as a build-up layer or a build-up wiring layer. The circuit board according to the present invention may be produced by any known method of manufacturing build-up wiring layers of printed circuit boards. The insulating layer 20 preferably contains resin that prevents damage of the build-up wiring layer when the build-up wiring layer is released following the cylindrical head 40 according to the present invention.

An optional solder resist layer and/or an optional metal surface treated layer (for example, a layer treated with an organic solderability preservative (OSP), an Au plated layer, and/or an Ni—Au plated layer) may be formed on the topmost of the build-up wiring layer.

EXAMPLES

The present invention will be described in more detail with reference to the following Examples.

Examples 1 to 5

(1) Production of Multilayered Laminate

A soda glass plate having a thickness of 1.1 mm was prepared as a support or carrier. An adhesive metal layer (a titanium layer having a thickness of 100 nm), an auxiliary release layer (a copper layer having a thickness of 100 nm), a release layer (an amorphous carbon layer having a thickness of 3 nm), and an extremely thin copper layer (a copper layer having a thickness of 300 nm) were in sequence formed on the soda glass plate through a sputtering process, resulting in a cupper foil with a carrier. A multilayered circuit board including a wiring layer having a two-layer structure (a composite layer consisting of an insulating layer and a wiring layer and having a total thickness of 0.03 mm. The wiring layer on the release layer had a width of 10 μm) was formed on the extremely thin copper layer of the resultant cupper foil with a carrier through a build-up process, resulting in a composite laminate having dimensions of 510 mm by 400 mm.

(2) Release of Support or Multilayered Circuit Board

Figure 4:
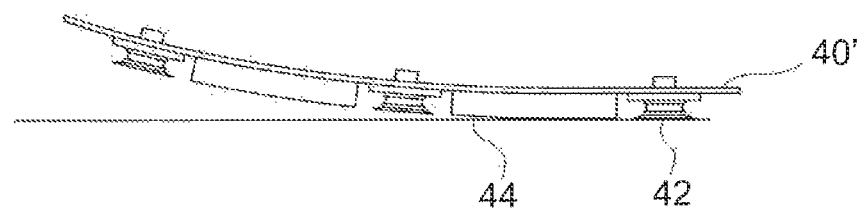
FIG. 4 illustrates an exemplary cylindrical head used in Examples.

Cylindrical heads having various curvature radii shown in Table 1 were prepared. FIG. 4 illustrates an exemplary cylindrical head. A cylindrical head 40' in FIG. 4 (composed of a stainless steel SUS304) included a cylindrical plate having a predetermined curvature radius. The cylindrical plate was provided with suckers 42 (composed of an acrylonitrile butadiene rubber) and spacers 44 (composed of an acrylonitrile butadiene rubber) on one side. The suckers 42 each had a suction hole. Each suction hole was brought into communication with a vacuum pump. As illustrated in FIGS. 1 and 2, a flat stage 30 (composed of a stainless steel SUS304) was prepared. The flat stage 30 also had suction holes. These suction holes were also brought into communication with the vacuum pump. As illustrated in FIG. 1, the composite laminate 26 produced in Step (1) was disposed onto the flat stage 30 such that the support 12 faced the flat stage 30. The vacuum pump was operated for vacuum suction of the composite laminate 26 through the suction holes 30a. The composite laminate 26 was thereby put into tight contact with the flat stage 30. The suction holes in the suckers 42 were also kept vacuum for suction. While the composite laminate 26 was kept in tight contact with the flat stage 30, the end of the multilayered circuit board 25 was brought into contact with the cylindrical head 40' for vacuum suction of the multilayered circuit board 25 through the suction holes of the suckers 42. In this state, the cylindrical head 40' was rolled on the composite laminate 26 to increase the area of the composite laminate 26 in tight contact with the cylindrical head 40'. The multilayered circuit board 25 was released at a releasing rate of 0.2 m/s through vacuum suction to the cylindrical head 40'. The release strength between the support 12 and the extremely thin copper layer was 5 gf/cm. The vacuum pressures for suction of the flat stage 30 and the cylindrical head 40' were adjusted such that the fixation strengths between the flat stage 30 and the composite laminate 26 and between the cylindrical head 40' and the composite laminate 26 were 50 to 100 times the release strength. In this manner, supports 12 or multilayered circuit boards 25 were released to form convex faces with curvature radii shown in Table 1.

(3) Evaluation

The supports 12 and the multilayered circuit boards 25 after release were observed and evaluated on the following criteria. The results are shown in Table 1.

<Evaluation 1: Breaking in Support>

Rating A: no breaking in the support.

Rating B: breaking at an end of the support.

Rating C: breaking in the central portion of the support (unacceptable).

<Evaluation 2: Cracking in Multilayered Circuit Board>

Rating AA: cracking rate of 0%

Rating A: cracking rate above 0% and below 5%

Rating B: cracking rate of 5% or more and below 10%

Rating C: cracking rate of 10% or more (unacceptable)

<Overall Evaluation>

Rating AA: rating AA in evaluation 2 and rating A in evaluation 1

Rating A: rating A in both evaluations 1 and 2

Rating B: rating B or better in both evaluations 1 and 2, excluding those falling under rating AA or A in overall evaluation Rating C: rating C in at least one of evaluations 1 and 2 (unacceptable)

Example 6 (Comparative)

The circuit boards were manufactured and evaluated as in Examples 1 to 5 except that no cylindrical head was used and one end of the multilayered circuit board was gripped and released by hand. The results are shown in Table 1.

Example 7 (Comparative)

The circuit boards were manufactured and evaluated as in Examples 1 to 5 except that a flat head was used instead of the cylindrical head. The results are shown in Table 1.

TABLE 1

| | Manufacturing Condition | Evaluation | | |
| --- | --- | --- | --- | --- |
| | Curvature Radius of Head (mm) | Breaking in Support | Cracking in Multilayered Circuit Board | Overall Rating |
| Ex. 1 | 300 | A | B | B |
| Ex. 2 | 500 | A | A | A |
| Ex. 3 | 1500 | A | AA | AA |
| Ex. 4 | 2000 | A | A | A |
| Ex. 5 | 4000 | B | B | B |
| Ex. 6* | 180 or less (no head used and circuit board gripped by hand) | A | C | C |
| Ex. 7* | ∞ (flat head used) | C | C | C |

*indicates Comparative Examples.

The invention claimed is:

1. A method of manufacturing a circuit board, comprising:
   (a) preparing a composite laminate comprising, in sequence,
   a support,
   an adhesive metal layer composed of at least one metal selected from the group consisting of Ti, Cr, and Ni,
   an auxiliary release layer composed of copper,
   a release layer, and
   a multilayered circuit board;
   (b) disposing the composite laminate on a stage such that one face of the composite laminate is put into tight contact with the stage; and
   (c) releasing the support or the multilayered circuit board from the release layer such that the support or the multilayered circuit board forms a convex face with a curvature radius of 1500 to 5000 mm while the face of the composite laminate is kept in tight contact with the stage.

2. The method according to claim 1, wherein (c) comprises putting a cylindrical head into contact with another face, remote from the stage, of the composite laminate.

3. The method according to claim 2, wherein (c) comprises:
   putting one end of the other face, remote from the stage, of the composite laminate into tight contact with the cylindrical head; and thereafter
   rolling the cylindrical head on the composite laminate to increase an area of the composite laminate in tight contact with the cylindrical head thereby releasing the support or the multilayered circuit board from the release layer.

4. The method according to claim 3, wherein a releasing rate for releasing the support or the multilayered circuit board from the release layer in (c) is 0.01 to 2.0 m/s.

5. The method according to claim 2, wherein (c) further comprises:
   disposing a roller between the support and the multilayered circuit board at one end of the composite laminate; and thereafter
   rolling the cylindrical head and the roller synchronously to release the support or the multilayered circuit board from the release layer.

6. The method according to claim 5, wherein a releasing rate for releasing the support or the multilayered circuit board from the release layer in (c) is 0.01 to 2.0 m/s.

7. The method according to claim 2, wherein a releasing rate for releasing the support or the multilayered circuit board from the release layer in (c) is 0.01 to 2.0 m/s.

8. The method according to claim 1, wherein a releasing rate for releasing the support or the multilayered circuit board from the release layer in (c) is 0.01 to 2.0 m/s.

* * * * *